(12) United States Patent
Fan et al.

(10) Patent No.: US 9,047,186 B2
(45) Date of Patent: Jun. 2, 2015

(54) ALLOCATION METHOD AND APPARATUS OF MODERATE MEMORY

(75) Inventors: Qinghua Fan, Shenzhen (CN); He Huang, Shenzhen (CN); Guoping Li, Shenzhen (CN)

(73) Assignee: ARTEK MICROELECTRONICS CO., LTD., Shenzhen (CN)

( * ) Notice: Subject to any disclaimer, the term of this patent is extended or adjusted under 35 U.S.C. 154(b) by 735 days.

(21) Appl. No.: 13/341,256

(22) Filed: Dec. 30, 2011

(65) Prior Publication Data

US 2012/0137104 A1 May 31, 2012

Related U.S. Application Data

(63) Continuation of application No. PCT/CN2010/076390, filed on Aug. 26, 2010.

(30) Foreign Application Priority Data

Aug. 28, 2009 (CN) .......................... 2009 1 0189918

(51) Int. Cl.
| | | |
|---|---|---|
| G06F 12/02 | (2006.01) | |
| G06F 11/07 | (2006.01) | |
| G11C 8/06 | (2006.01) | |

(Continued)

(52) U.S. Cl.
CPC ............ *G06F 11/073* (2013.01); *G06F 11/008* (2013.01); *G06F 11/076* (2013.01); *G06F 11/0793* (2013.01); *G11C 8/06* (2013.01); *G11C 16/349* (2013.01); *G11C 29/44* (2013.01); *G11C 2029/4402* (2013.01)

(58) Field of Classification Search
CPC ... G06F 11/073; G06F 11/008; G06F 11/076; G06F 11/0793; G11C 16/349; G11C 29/44; G11C 2029/4402
USPC ......... 711/173, 103, 104, 105, 154, 156, 165; 365/185.33; 714/6.13, 6.24, 25
See application file for complete search history.

(56) References Cited

U.S. PATENT DOCUMENTS

| | | | | |
|---|---|---|---|---|
| 7,478,285 | B2 * | 1/2009 | Fouquet-Lapar | ............... 714/42 |
| 8,230,302 | B2 * | 7/2012 | Hung et al. | ................... 714/764 |

(Continued)

FOREIGN PATENT DOCUMENTS

| | | | | |
|---|---|---|---|---|
| CN | 101243417 | | 7/2006 | .............. G06F 12/16 |
| CN | 101178689 | | 5/2008 | .............. G06F 12/06 |

(Continued)

*Primary Examiner* — Stephen Elmore
(74) *Attorney, Agent, or Firm* — Hamre, Schumann, Mueller & Larson, P.C.

(57) ABSTRACT

An allocation method comprises: partitioning moderate memory into a plurality of physical memory pages having predetermined page size according to the predetermined page size; scanning the moderate memory using the predetermined page size and recording the physical address and damage degree of each physical memory page; obtaining the allocation information of the physical memory pages when a memory request is received and allocating physical memory to the request based on the recorded physical address and damage degree of each physical memory page and the obtained allocation information. A moderate memory is scanned and the physical address and damage degree of each physical memory page are recorded, then the physical memory is allocated based on the recorded physical address and damage degree of each physical memory page and the obtained allocation information.

15 Claims, 4 Drawing Sheets

(51) Int. Cl.
*G11C 29/44* (2006.01)
*G06F 11/00* (2006.01)
*G11C 16/34* (2006.01)

(56) References Cited

U.S. PATENT DOCUMENTS

| | | | | |
|---|---|---|---|---|
| 8,453,022 | B2* | 5/2013 | Katz | 714/719 |
| 2004/0083334 | A1* | 4/2004 | Chang et al. | 711/103 |
| 2009/0259799 | A1* | 10/2009 | Wong | 711/103 |
| 2009/0282186 | A1* | 11/2009 | Mokhlesi et al. | 711/103 |
| 2010/0122114 | A1* | 5/2010 | Hung et al. | 714/6 |
| 2010/0161881 | A1* | 6/2010 | Nagadomi et al. | 711/103 |

FOREIGN PATENT DOCUMENTS

| | | | |
|---|---|---|---|
| WO | 2006/108755 | 10/2006 | G06F 3/06 |
| WO | 2006/123351 | 11/2006 | G06F 12/08 |

\* cited by examiner

| 3 | 0 | 0 | 0 | 0 | 3 | 0 | 0 | 0 | 2 | 2 | 0 | 0 | 0 | 0 | 0 | 3 | 2 | 2 | 2 | 2 | 2 | 2 | 0 | 0 | 0 | 0 | 0 | 0 | 0 | 0 | ... |
|---|---|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 10| 11| 12| 13| 14| 15| 16| 17| 18| 19| 20| 21| 22| 23| 24| 25| 26| 27| 28| 29| 30| |

ALLOCATION METHOD AND APPARATUS OF MODERATE MEMORY

BACKGROUND OF THE INVENTION

1. Technical Field

The present invention relates to the field of memory, and more particularly, to an allocation method and apparatus of moderate memory.

2. Description of Related Art

One of the typical microcontrollers is comprised as shown in FIG. 1. Generally, physical memory is managed by an operating system (OS) through Memory Management Unit (MMU), and application programs are run based on logical address space instead of accessing physical memory directly.

The physical memory typically is managed in form of paging according to modern OS where page size of the physical memory, exemplarily, may be 1 Kbyte, 4 Kbyte, 16 Kbyte and 1 Mbyte. Generally, when an application program is created, one page of physical memory is allocated and mapped into the logical address space of the application program by the OS. If the logical address of the page accessed by the application program isn't in the physical memory, a certain exception will be caused. After the exception handler of the OS allocates one free page to the application program and makes page mapping between the page and the logical address space, the application program can be run continually.

In an embedded system, it is necessary that data is exchanged directly (including writing data into memory and reading data from memory) between some devices inside or outside of embedded chip and memory, i.e. Direct Memory Access (DMA), in which MMU is not required. Therefore the page mapping executed by the microcontrollers is imperceptible and the devices need to access successive physical address space directly.

In an electronic system, memory generally is used as execution space of programs. The code segment, the data segment, the stack space of the programs and so on run in the memory. It doesn't allow 1 bit or more than 1 bit damage in the memory for storing code segment, otherwise the instruction code stored in the damaged bits is changed, and unpredictable errors may occur when the instruction code is executed. However, the flow errors of the programs may not occur when there is some damage in the memory for storing the data segment and the stack space. It at most, for example, brings in an abnormal pixel in a display if the data on damaged bits are just the data used for output to the display. However, if the damaged data relates to a condition for the execution of a program, the damaged data will cause the flow errors of the program.

In summary, an electronic system may be compatible with moderate memory, wherein the moderate memory refers to the memory having defective bits. In prior art, almost all of the methods accommodate moderate memory in the form of hardware, i.e. by partitioning the address wire or data wire so that high-capacity memory is "degraded" into small-capacity memory for use or abstracting a plurality of moderate memory pieces into one integral memory piece. However, those methods accommodating moderate memory are costly and the efficiency of moderate memory is low.

BRIEF SUMMARY OF THE INVENTION

A technical problem to be solved by the present invention is to overcome the shortcomings of the prior art and provide an allocation method and apparatus of moderate memory.

One objective of the present invention embodiment is to provide an allocation method of moderate memory, comprising:

A) partitioning moderate memory into a plurality of physical memory pages having predetermined size according to the a predetermined page size;

B) scanning the moderate memory using the predetermined page size and recording the physical address and damage degree of each physical memory page;

C) obtaining the allocation information of the physical memory pages when a memory request is received and allocating physical memory to the request based on the recorded physical address and damage degree of each physical memory page and the obtained allocation information.

Another objective of the present invention embodiment is to provide an allocation apparatus of moderate memory, comprising:

paging unit used for partitioning moderate memory into a plurality of physical memory pages having predetermined page size according to the a predetermined page size;

memory scanning unit used for scanning the moderate memory using the predetermined page size and recording the physical address and damage degree of each physical memory page; and memory allocation unit used for obtaining the allocation information of the physical memory pages when a memory request is received and allocating physical memory to the request based on the recorded physical address and damage degree of each physical memory page and the obtained allocation information.

In the embodiment of the present invention, the moderate memory is partitioned into a plurality of physical memory pages having predetermined page size, the moderate memory is scanned using the predetermined page size, the physical address and damage degree of each physical memory page are recorded, then the physical memory is allocated to the memory request based on the recorded physical address and damage degree of each physical memory page and the obtained allocation information. Thus the severely damaged physical memory pages are abandoned, the moderately damaged physical memory pages are used to the greatest extent and the efficiency of moderate memory can be improved. Additionally, by classifying the physical memory pages into different damage levels and allocating memory based on the damage levels, the efficiency of moderate memory can be improved greatly. Additionally, the areas of the physical memory pages having different damage levels are sorted in the ascending order of their areas. If the memory request is normal memory having a damage level, a search in the areas is conducted. When an area having the damage level is retrieved, unoccupied physical memory pages in the area are allocated to the request in the ascending order of physical addresses. If the received request is a successive physical memory request whose size is greater than the predetermined threshold, a search in the areas of the physical memory pages having a damage level is conducted in the descending order of their sizes. If an area having the damage level is retrieved, the unoccupied physical memory pages in the area are allocated to the request in the descending order of physical addresses, thus the success rate of the successive physical memory allocation is improved.

DETAILED DESCRIPTION OF THE INVENTION

Hereinafter, the present invention will be further detailed in conjunction with the attached drawings and embodiments thereof in order to make the objectives, technical solutions and advantages of the present invention more apparent. It shall be appreciated that, the embodiments described herein are only intended to illustrate but not to limit the present invention.

In the embodiment of present invention, the moderate memory is partitioned into a plurality of physical memory pages having predetermined page size according to the predetermined page size, the moderate memory is scanned using the predetermined page size, and the physical address and damage degree of each physical memory page are recorded, then the physical memory is allocated to the request based on the recorded physical address and damage degree of each physical memory page and the obtained allocation information. Thus the severely damaged physical memory pages are abandoned and the moderately damaged physical memory pages are used to the greatest extent, which improves the efficiency of the moderate memory.

Figure 1:
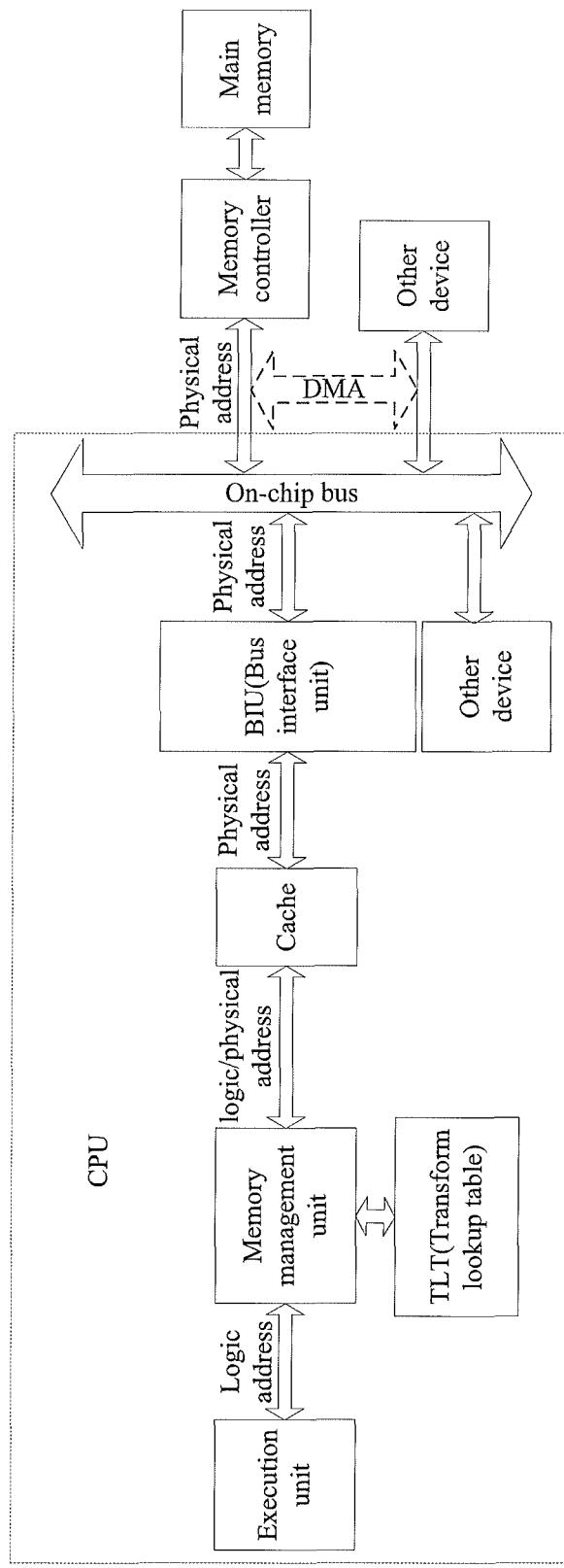
FIG. 1 is a structure block diagram of microcontroller according to the prior art.
Figure 2:
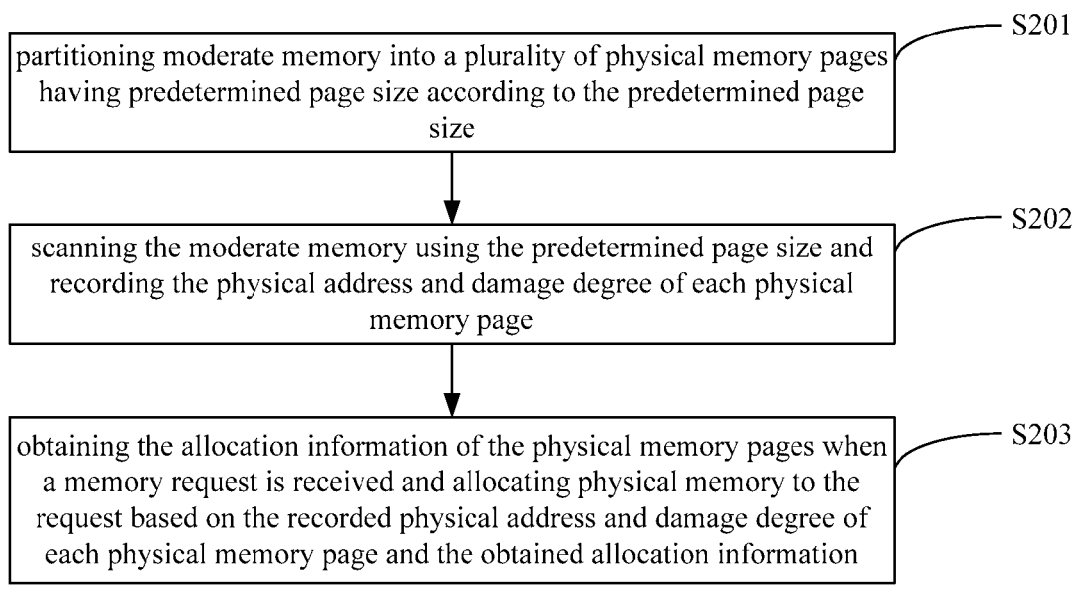
FIG. 2 is a flow diagram of the allocation method of moderate memory according to the embodiment of the present invention.

FIG. 2 is a flow diagram of the allocation method of moderate memory and the flow process is detailed as follows:

step S201: partitioning moderate memory into a plurality of physical memory pages having predetermined page size according to the predetermined page size.

In the embodiment of the present invention, the predetermined page size P is determined according to the terminal that the moderate memory belongs to and the page size supported by the OS.

step S202: scanning the moderate memory using the predetermined page size and recording the physical address and the damage degree of each physical memory page, wherein the damage degree of each physical memory page indicates the number of defective bits in the physical memory page.

When one physical memory page is occupied, the physical memory page can't be allocated to application programs, no matter if the physical memory page is damaged, otherwise disorder is brought in. Therefore, it is necessary to mark the physical memory page in the process of the physical memory allocation in order to record the allocation information of the physical memory page, wherein the allocation information refers to "occupied" or "unoccupied".

In the embodiment of the present invention, the moderate memory is scanned using the predetermined page size P so that the physical address and the number of the defective bits of each physical memory page can be obtained. Then the damage degree of the physical memory page can be determined based on the obtained number of the physical memory page.

In electronic systems, memory generally is used as execution space of an application program where the code segment, the data segment, the stack space of the program and so on is run. If there is any damage in the memory space for storing code segment, the flow error of the application program may be caused and even unpredictable error may be brought in. Therefore, the memory space for storing code segment of the application program can't accommodate any damage in order to avoid unpredictable errors. The flow error of the application program may not occur when there are some damage in the memory space for storing the data segment and the stack space. It at most, for example, brings in an abnormal pixel in a display if the damage data is just used for output to the display. However, if the damage data relates to the judgment used for the flow of the application program, the flow errors of the program occur.

In order to improve the utilization efficiency of the moderate memory based on the memory requirements of the request, according to the embodiment of the present invention the method further comprises:

classifying physical memory pages and obtaining the damage level of each physical memory page based on the damage degree of each physical memory page and the predetermined classification standard. The classification standard of a physical memory page may be determined by the memory allocation information of an electronic system, as an example, the physical memory pages are classified into three levels: superior page referring to the physical memory page having no defective bit, moderate page referring to the physical memory page having defective bits whose number is no more than a predetermined value and inferior page referring to the physical memory page having defective bits whose number is greater than the predetermined value. Definitely, the classification standard of the physical memory page may be others which aren't used to limit the present invention.

When the physical memory pages, exemplarily, are classified into superior page, moderate page and inferior page, the damage level of a physical memory page, i.e. superior page, moderate page and inferior page, can be obtained after the physical memory page has been classified according to the damage degree of the physical memory page.

In order to describe the present invention conveniently, in the following description of the embodiment, the physical memory pages, exemplarily, are classified into superior page, moderate page and inferior page.

In an electronic system, the memory for storing code segment, some data segments and stack spaces of an application program can't accommodate any damage. There is a threshold of moderate memory compatible with each electronic system. For example, when it is required that the size of the memory space of superior pages is equal or greater than 3M, if a physical memory is scanned and the size of the memory space of the superior pages is smaller than 3M, it is impossible for the physical memory compatible with the electronic system, no matter what allocation method of moderate memory is adopted. Therefore, in order to avoid above-mentioned problem, according to another embodiment of the present invention after the step of scanning the moderate memory using the predetermined page size, the allocation method further comprises:

A) predetermining a threshold of moderate memory compatible with the electronic system.

When physical memory pages, exemplarily, are classified into superior page, moderate page and inferior page, the threshold of moderate memory includes: the occupied maximal capacity L of the superior page, the occupied maximal capacity L1 of the moderate page, the occupied maximal capacity N of the successive superior page, and the occupied maximal capacity N1 of the successive moderate page. L, L1, N and N1 are integral multiple of P which is the predetermined page size of physical memory page.

B) determining if the electronic system is compatible with the moderate memory according to the damage degree of the moderate memory obtained by memory scanning and the predetermined threshold of moderate memory compatible with the electronic system.

When physical memory pages, exemplarily, are classified into superior page, moderate page and inferior page, as the moderate memory is scanned, the allocation method obtains the overall capacity L' of the superior page, the overall capacity L1' of the moderate page, the capacity N' of the area of maximal successive superior page, and the capacity N1' of the area of maximal successive moderate page. Then the allocation method determines if the electronic system is compatible with the moderate memory according to the damage degree of the scanned moderate memory and the predetermined threshold of moderate memory by the electronic system, comprising:

Determining if the following inequalities are right:
a) $L'>=L$,
b) $N'>=N$,
c) $L'+L1'>=L+L1$,
d) $N'+Nr>=N+N1$;

When all of the aforementioned inequalities are right, it is determined that the electronic system is compatible with the moderate memory. Then physical address and the damage degree of the physical memory pages are recorded, otherwise it indicates that the electronic system isn't compatible with the moderate memory and prompt that the moderate memory is so severely damaged that the electronic system is incompatible with the moderate memory.

Figure 3:
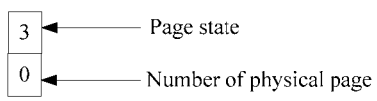
FIG. 3 is a schematic view of the damage degree of physical memory pages, physical addresses and allocation information of moderate memory recorded after the moderate memory is scanned.

FIG. 3 is a schematic view of the damage level of physical memory pages, physical addresses and allocation information of moderate memory recorded after the moderate memory is scanned. 2 bit is used for recording the physical address, damage degree and allocation information of the physical memory page, wherein 0b00 refers to the unoccupied superior page, 0b01 refers to the occupied superior page, 0b10 refers to the unoccupied moderate page, and 0b11 refers to the occupied superior page or the inferior page. The first row is the damage degree and the allocation information of physical memory page and the second row is the physical address.

step S203: obtaining the allocation information of the physical memory pages when a memory request is received and allocating the physical memory to the request based on the recorded physical address and damage degree of each physical memory page and the obtained allocation information.

When a certain memory page is allocated, i.e. the memory page is occupied, the memory page can't be allocated to an application program no matter if the memory page is damaged, and otherwise the disorder is caused. Therefore, during the physical memory allocation, it is necessary to store the allocation information, i.e. "unoccupied" or "occupied". When a physical memory page has been allocated, i.e. the physical memory page has been occupied, the allocation information of the physical memory page is marked with "occupied". When a memory request of physical memory is received, the allocation methods obtains the allocation information of physical memory pages and allocates physical memory to the request based on the recorded physical address and damage degree of each physical memory page and the allocation information.

In the embodiment of the present invention, when a memory request is received, such as the memory request of an application program, the physical memory pages having defective bits whose number is less than or equal to the predetermined number are allocated to the memory request of the application program whose flow will not be changed even if the allocated memory pages are damaged. For example, memory pages may be allocated to the memory request for data segments and stack spaces of the application program whose flow will not be changed even if the allocated memory pages are damaged. The physical memory pages having no defective bit are allocated to the memory request of the application program whose flow will be changed if the allocated memory pages are damaged. For example, the physical memory pages having no defective bit should be allocated to the code segments and the data segments or stack spaces of the application program whose flow will be changed if the allocated memory pages are damaged.

After physical memory pages in moderate memory are classified and the damage level is obtained, a physical memory is allocated to the memory request based on the obtained damage level. Moderate pages may be allocated to the memory request of the application program whose flow will not be changed even if the allocated memory pages are damaged. For example, moderate pages may be allocated to the memory request for data segments and stack spaces of the application program whose flow will not be changed even if the allocated memory pages are damaged. The superior pages are allocated to the memory request of the application program whose flow will be changed if the allocated memory pages are damaged. As an example, the superior pages may be allocated to the code segments and the data segments or stack spaces of an application program whose flow will be changed if the allocated memory pages are damaged. In order to improve the successful rate of the successive memory allocation, another embodiment of the present invention allocates the physical memory to the request based on the recorded physical address and damage degree of each physical memory page and the obtained allocation information, comprising:

A) determining the threshold M of the number of the available successive physical memory pages with the same damage level according to the allocation information of memory in the electronic system;

After the physical memory pages are classified into superior pages, moderate pages and inferior pages, the threshold K of the number of the available successive superior pages is determined and the threshold K1 of the number of the available successive moderate pages is determined.

B) if the received request is the memory allocation of physical memory pages having any single damage level, conducting a search in the areas of the physical memory pages having the damage level in the ascending order of their sizes, after the area of the physical memory pages satisfied to the request is retrieved, conducting a search in the memory pages of the retrieved area in the ascending order of memory addresses, allocating unoccupied physical memory pages having the damage level to the request, otherwise returning the corresponding prompting information on failure;

As the physical memory pages, exemplarily, are classified into superior page, moderate page and inferior page, if the received request is superior pages or moderate pages, the allocation method conducts a search in the areas of superior pages or moderate pages in ascending order of the sizes. After an area of superior pages or moderate pages satisfied to the request is retrieved, a search in the area of superior pages or moderate pages is conducted in the ascending order of the physical addresses. If unoccupied superior pages or moderate pages are retrieved, the unoccupied superior pages or moderate pages are allocated to the request, otherwise the corresponding prompting information on failure is returned.

Figures 4, 5:
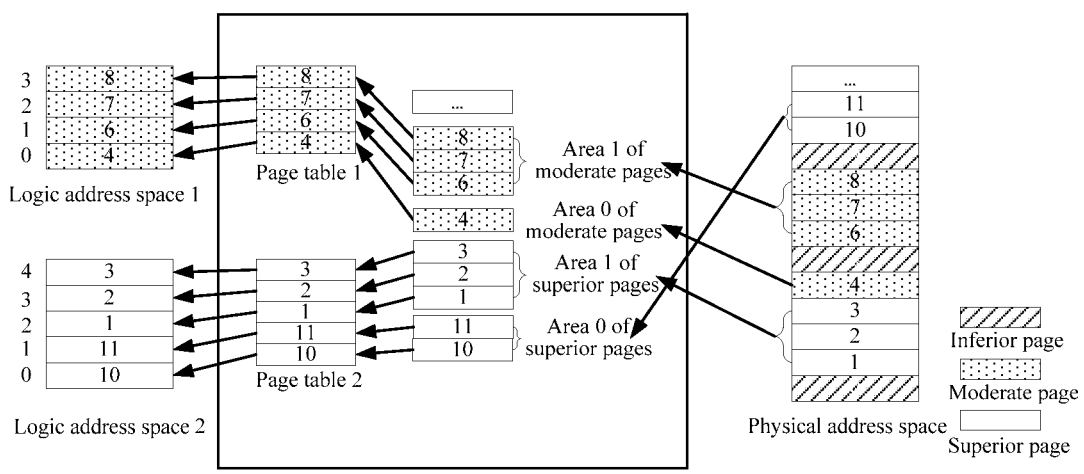
FIG. 4 is a schematic view of the areas of the superior memory and moderate memory in the ascending order of the sizes of the areas in FIG. 3.
FIG. 5 is a schematic diagram of the memory space of successive logic addresses mapped from physical memory according to the damage degree of physical memory pages.

FIG. 4 is a schematic view of the superior memory areas and moderate memory areas in the ascending order of the sizes of the areas in FIG. 3 according to the embodiment of the present invention.

C) when the memory request is the successive physical memory pages having the same damage level whose capacity is less than or equal to M, conducting a search in the areas of the physical memory pages having the same damage level in the ascending order of their areas, after the area of the physical memory pages having the damage level satisfied to the request is retrieved, conducting a search in the area of the memory pages having the damage level in the ascending order of physical addresses, allocating an unoccupied successive physical memory pages having the same damage level to the request, otherwise returning the corresponding prompting information on failure;

When the physical memory pages, exemplarily, are classified into superior page, moderate page and inferior page, if the received memory request is successive superior pages whose number is less than or equal to K, or successive moderate pages whose number is less than or equal to K1, a search in the areas of the superior pages or moderate pages in the moderate memory is conducted in the ascending order of their areas. After the area of the physical memory pages having the damage level satisfied to the request is retrieved, a search in the area of the memory pages having the damage level is conducted in the ascending order of physical addresses. Then if an unoccupied successive physical memory pages having the same damage level is retrieved, the unoccupied successive physical memory pages are allocated to the request, otherwise the corresponding prompting information on failure is returned.

D) when the memory request is the successive physical memory pages having the same damage level whose capacity is greater than M, conducting a search in the areas of the physical memory pages with the damage level in descending order of the sizes, after an area of the physical memory pages with the damage level satisfied to the request is retrieved, conduct a search in the area in the descending order of the physical addresses, if an unoccupied physical memory pages with the damage level is retrieved, allocate the unoccupied successive physical memory pages having the same damage level to the request, otherwise return the corresponding prompt on failure;

As the physical memory pages, exemplarily, are classified into superior page, moderate page and inferior page, if the memory request is successive superior pages whose capacity is greater than K or successive moderate pages whose capacity is greater than K1, a search is conducted in the areas of the superior pages or moderate pages in descending order of the sizes. After an area of superior pages or moderate pages satisfied to the request is retrieved, a search in the area is conducted in the descending order of the physical addresses. Then unoccupied successive superior pages or moderate pages satisfied to the request are allocated to the request, otherwise the corresponding prompt on failure is returned.

E) updating the allocation information of the physical memory pages and mapping the allocated physical memory pages into logical address space when the memory request is the memory of the logical address space, for example, the allocated physical memory is marked with "occupied".

FIG. 5 is the schematic diagram illustrating the mapping from physical memories pages to the memory space having successive logical address based on the damage degree of the physical memory pages according to the embodiment of the present invention.

The following details the memory allocation process, exemplarily, in the booting phase of OS when the physical memory pages are classified into superior page, moderate page and inferior page.

In the booting phase of OS, firstly, the bootstrap of the OS reads the table having the physical address, damage degree and allocation information of the physical memory pages in moderate memory, sorts the areas of the superior pages and moderate pages in the ascending order of their areas, and further sorts the physical memory pages in the areas according to the ascending order of physical address, as shown in FIG. 4. Secondly, the bootstrap accesses the memory size occupied by the mirror of the OS, allocates superior pages and moderate pages to the OS in the ascending order of their areas of the superior pages and moderate pages and the ascending order of physical address in the same area of superior pages and moderate pages, loads the OS into allocated physical memory pages, makes corresponding mapping between the allocated pages and the table and updates the allocation information of the occupied memory pages. At last, the bootstrap transmits the table recording the updated physical address, damage level and allocation information of the physical memory pages to the OS, starts the memory mapping and jumps to the entrance address of the OS.

In summary, the allocation method of moderate memory according to the embodiment of the present invention comprises:

A) partitioning moderate memory into a plurality of physical memory pages having predetermined page size according to the predetermined page size;

B) scanning the moderate memory using the predetermined page size, and recording the physical address and damage degree of each physical memory page;

C) obtaining the allocation information of the physical memory pages when a memory request is received and allocating the physical memory to the request based on the recorded physical address and damage degree of each physical memory page and the obtained allocation information.

Figure 6:
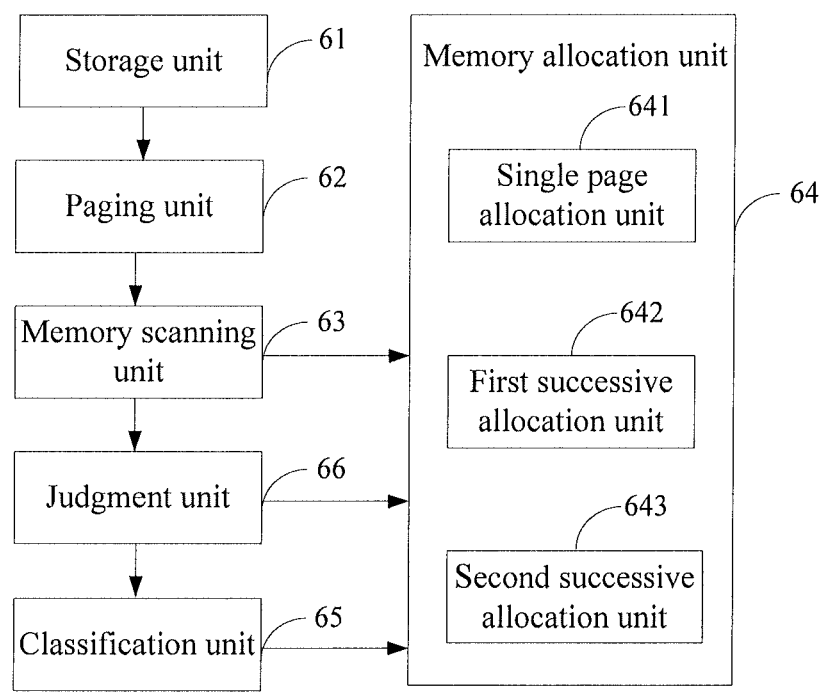
FIG. 6 is a structure block diagram of allocation apparatus of moderate memory according to the embodiment of the present invention.

FIG. 6 is the structure of the allocation apparatus of moderate memory according to the embodiment of the present invention. In order to describe the embodiment conveniently, the parts relating to the embodiment is presented. The allocation apparatus may be a software unit, a hardware unit or a unit combining software unit and hardware that is set in any electronic device having memory, and also may be used as a independent mounting part integrated into any electronic device having memory or application programs thereof, comprising:

Storage unit 61, used to store predetermined page size of the moderate memory. In the embodiment of the present invention, storage unit 61 is also used to store one or more of the predetermined classification standard of physical memory pages, the threshold compatible with the electronic system and the threshold of successive unoccupied physical memory having the same damage level.

The classification standard, used to classify the physical pages into a plurality of damage levels according to the damage degree of physical memory pages. For example, physical memory pages may be classified into superior page having no defective bit, moderate page having defective bits whose number is no more than a predetermined number and inferior page having defective bits whose number is greater than the predetermined number. Definitely, the physical memory pages may be classified into more levels or less levels according to the allocation information of physical memory in the electronic system.

The threshold of the moderate memory refers to the thresholds of the moderate memory compatible with the electronic system. When physical memory pages are classified into superior pages, moderate pages and inferior pages, the thresholds of moderate memory includes: the occupied maximal memory capacity L of the superior pages, the occupied maximal memory capacity L1 of the moderate pages, the occupied maximal memory capacity N of the area having successive superior pages, and the occupied maximal memory capacity N1 of the area having successive moderate pages. L, L1, N and N1 are integral multiple of P which is the predetermined page size of a physical memory page in moderate memory.

In order to avoid memory fragmentation to the greatest extent, the allocation apparatus may predetermine the threshold of the successive physical memory having the same damage level available for a memory request. When physical memory pages, exemplarily, are classified into superior pages, moderate pages and inferior pages, the allocation apparatus may predetermine the threshold of the successive physical memory having the same damage level available for an memory request, comprising: predetermining the threshold K of the successive superior physical memories and the threshold K1 of the successive moderate physical memories available for an memory request.

Paging unit 62 is used to partition moderate memory into a plurality of physical memory pages having predetermined page size.

Memory scanning unit 63 scans the moderate memory partitioned by the paging unit 62 using the predetermined page size, and records the physical address and damage degree of each physical memory page. The damage degree of each physical memory page indicates the number of defective bit in the physical memory page.

Memory allocation unit 64 obtains the allocation information of the physical memory pages when a memory request is received and allocates the physical memory to the request based on the recorded physical address and damage degree of each physical memory page and the obtained allocation information.

When a certain memory page is occupied, the memory page can not be allocated to an application program no matter if the memory page is damaged, otherwise the disorder is caused. Therefore, the allocation information, i.e. "occupied" or "unoccupied", of the physical memory pages is stored in the memory allocation unit 64 and the physical memory is allocated to the memory request based on the recorded physical address and damage degree of each physical memory page. In the embodiment of the present invention, when the memory request of physical memory is received, such as the memory request of physical memory from an application program, the physical memory pages having defective bits whose number is less than or equal to the predetermined number are allocated to the memory request of the application program whose flow will not be changed even if the allocated corresponding memory pages are damaged. For example, the physical memory pages can be allocated to the memory request and used for data segments and stack spaces of an application program whose flow will not be changed even if the allocated corresponding memory pages are damaged. The physical memory pages without defective bits are allocated to the memory request of the application program whose flow will be changed if the allocated corresponding memory pages are damaged. For example, the physical memory pages without defective bits should be allocated to the code segments of an application program and the data segments or stack spaces of an application program whose flow will be changed if the allocated corresponding memory pages are damaged.

In an electronic system, the physical memory for the code segment storing an application program, some data segment and stack space can't have any damage, therefore, there is a threshold of the moderate memory compatible with the electronic system. In order to avoid unpredictable mistakes that'll happen in the miming of an application program, in the embodiment of the present invention, the allocation apparatus further comprises a judgment unit 66 that is used to judge if the electronic system is compatible with moderate memory according to the threshold of moderate memory compatible with the electronic system stored by storage unit 61 and the damage degree of the moderate memory obtained by memory scanning unit 63.

When physical memory pages are classified into superior pages, moderate pages and inferior pages, the allocation apparatus should predetermine the occupied maximal memory capacity L of the superior pages, the occupied maximal memory capacity L1 of the moderate pages, the occupied maximal memory capacity N of the area having successive superior pages and the occupied maximal memory capacity N1 of the area having successive moderate pages. When the memory scanning unit 63 obtains the following parameters about the moderate memory: the occupied maximal memory capacity $L'$ of the superior pages, the occupied maximal memory capacity $L1'$ of the moderate pages, the occupied maximal memory capacity $N'$ of the area having successive superior pages and the occupied maximal memory capacity $N1'$ of the area having successive moderate pages, judgment unit 66 judges if the following inequalities are correct:

a) $L' >= L$,
b) $N' >= N$,
c) $L'+L1' >= L+L1$,
d) $N'+N1' >= N+N1$

If the above-mentioned inequalities are correct, judgment unit 66 can concludes that the electronic system is compatible with the moderate memory, otherwise the electronic system is incompatible with the moderate memory. When the electronic system is compatible with the moderate memory, memory scanning unit 63 records the physical address and damage degree of the each physical memory page, otherwise the allocation apparatus prompts that the moderate memory is so severely damaged that the electronic system is incompatible with the moderate memory when judgment unit 66 concludes that the electronic system is compatible with the moderate memory.

In order to improve the efficiency of the moderate memory, in the embodiment of the present invention, the allocation apparatus further comprises classification unit 65. Classification unit 65 classifies the physical pages of moderate memory into different levels and obtains the damage level of physical memory pages according to the damage degree of the physical pages recorded by memory scanning unit 63 and the classification standard of physical memory pages stored by storage unit 61. Thus memory allocation unit 64 allocates physical memory to a received memory request according to the damage level of physical memory pages obtained by classification unit 65.

When physical memory pages exemplarily, are classified into superior pages, moderate pages and inferior pages, classification unit 65 classifies the memory pages into superior pages, moderate pages and inferior pages according to the number of defective bits detected in the physical memory pages.

In order to improve the success rate of the memory allocation for a memory request, in the embodiment of the present invention, memory allocation unit 64 comprises:

If the received request is the memory allocation of physical memory pages with any single damage level, single page allocation unit 641 conducts a search in the areas of the physical memory pages with the damage level in the ascending order of their areass. After an area of the physical memory pages satisfied to the request is retrieved, a search in the area in ascending order of physical addresses is conducted by the single page allocation unit 641, the unoccupied physical memory pages having the damage level in the area are allocated to the request, otherwise fail to memory request is returned and the corresponding information is prompted.

When physical memory pages, exemplarily, are classified into superior pages, moderate pages and inferior pages, if the request received by single page allocation unit 641 is the memory allocation of superior pages or moderate pages, single page allocation unit 641 conducts a search in the areas of superior pages or moderate pages in ascending order of the sizes. After the area of superior pages or moderate pages satisfied to the request is retrieved, a search in the memory pages in the area in the ascending order of the physical addresses is conducted. Then unoccupied superior pages or moderate pages are allocated to the request, otherwise fail to memory request is returned and the corresponding information is prompted.

If the memory request is the successive physical memory pages having the same damage level whose capacity is less than or equal to M, in the ascending order of their areas, a search in the areas of the physical memory pages having the same damage level is conducted by first successive allocation unit 642. After an area of the physical memory pages having the damage level satisfied to the request is retrieved, a search in the memory pages in the area in the ascending order of their physical addresses is conducted by first successive allocation unit 642. The unoccupied successive physical memory pages having the same damage level in the area are allocated to the request by first successive allocation unit 642; otherwise fail to memory request is returned and the corresponding information is prompted. M is the predetermined threshold of unoccupied physical memory pages having the same damage level.

As physical pages, exemplarily, are classified into superior pages, moderate pages and inferior pages, if the memory request received by first successive allocation unit 642 is successive superior pages whose capacity is less than or equal to K, or successive moderate pages whose capacity is less than or equal to K1, a search in the areas of the superior or moderate pages is conducted by first successive allocation unit 642 in the ascending order of their areas. After an area of the superior pages or moderate pages satisfied to the request is retrieved, a search in the memory pages in the area in the ascending order of their physical addresses is conducted by first successive allocation unit 642. The unoccupied superior pages or moderate pages in the area are allocates to the request and the allocation information of the allocated physical memory is updated, otherwise fail to memory request is returned and the corresponding information is prompted.

When the memory request received by second successive allocation unit 643 is successive physical memory pages having the same damage level whose capacity is greater than M, a search in the areas of the physical memory pages having the same damage level is conducted by the second successive allocation unit 643 in the descending order of their areas. After an area of the physical memory pages having the damage level satisfied to the request is retrieved, a search in the memory pages in the area in the descending order of their physical addresses is conducted by second successive allocation unit 643. The unoccupied successive physical memory pages having the same damage level in the area are allocated to the request; otherwise fail to memory request is returned and the corresponding information is prompted. M is the predetermined threshold of unoccupied physical memory pages having the same damage level.

As physical pages, exemplarily, are classified into superior pages, moderate pages and inferior pages, if the memory request received by second successive allocation unit 643 is successive superior pages whose capacity is greater than K, or successive moderate pages whose capacity is greater than K1, a search in the areas of the superior pages or moderate pages is conducted by the second successive allocation unit 643 in the descending order of their areas. After an area of the superior pages or moderate pages satisfied to the request is retrieved, a search in the memory pages in the area is conducted by the second successive allocation unit 643 in the descending order of their physical addresses. The unoccupied superior pages or moderate pages in the area are allocated to the request and the allocation information of the allocated physical memory pages is updated, otherwise fail to memory request is returned and the corresponding information is prompted.

Memory mapping unit 644 maps the allocated physical memory pages into logical address space recorded in the allocation information and updates the allocation information of the physical memory pages when the memory request is the memory of the logical address space, for example, the allocated physical memory is marked with "occupied".

In the embodiment of the present invention, moderate memory is partitioned into a plurality of physical memory pages having predetermined page size, the moderate memory is scanned using the predetermined page size, the physical address, damage degree and allocation information of each physical memory page are recorded, then the physical memory is allocated to the request based on the recorded physical address and damage degree of each physical memory page and the obtained allocation information so that the severely damaged physical memory pages are abandoned, the moderately damaged physical memory pages are used to the greatest extent, which improves the efficiency of the moderate memory. In the embodiment of the present invention, the areas of the physical memory pages having different damage levels are sorted in the ascending order of their areas. If the received memory request is normal memory having a damage level, a search in the areas is conducted in the ascending order of areas. If unoccupied physical memory pages having the damage level are retrieved, the unoccupied physical memory pages are allocated to the request in the ascending order of physical addresses. If the received request is successive physical memory allocation whose size is greater than the predetermined threshold, a search in the areas of the physical memory pages having a damage level is conducted in the descending order of their areas. If unoccupied physical memory pages having the damage level are retrieved, the unoccupied physical memory pages are allocated to the request in the descending order of physical addresses, thus the success rate of the successive physical memory allocation is improved.

It should be recognized that the disclosed embodiments are illustrative only and should not be taken as limiting the scope of the invention. Any modifications, equivalent substitutions and improvements made within the spirit and principle of the present invention shall be all covered within the scope of the present invention.

The invention claimed is:

1. An allocation method of moderate memory performed by an electronic system including memory, comprising:
   A) partitioning moderate memory into a plurality of physical memory pages having predetermined page size according to the predetermined page size;
   B) scanning the moderate memory using the predetermined page size and recording a physical address and damage degree of each physical memory page;
   C) obtaining allocation information of the physical memory pages when a memory request is received and allocating physical memory to the request based on the recorded physical address and damage degree of each physical memory page and the obtained allocation information.

2. The allocation method of claim 1, wherein after the scanning step, the allocation method further comprises:
   determining if the moderate memory is compatible with the electronic system according to the damage degree of the moderate memory obtained by the scanning step and a predetermined threshold of the moderate memory compatible with the electronic system.

3. The allocation method of claim 1, wherein after the step of obtaining the allocation information, the method further comprises:
   recording the allocation information in the step of allocating the physical memory.

4. The allocation method of claim 1, wherein before the step C), the method further comprises:
   C0) classifying physical memory pages and obtaining a damage level of each physical memory page based on the damage degree and a predetermined classification standard of the physical memory page.

5. The allocation method of claim 2, wherein before the step C), the method further comprises:
   C0) classifying physical memory pages and obtaining a damage level of each physical memory page based on the damage degree and a predetermined classification standard of the physical memory page.

6. The allocation method of claim 3, wherein before the step C), the method further comprises:
   C0) classifying physical memory pages and obtaining a damage level of each physical memory page based on the damage degree and a predetermined classification standard of the physical memory page.

7. The allocation method of claim 4, wherein the step C) further comprises:
   C1) conducting a search in areas of the physical memory pages having a same damage level in ascending order of their areas if the received memory request is physical memory pages having any single damage level, conducting a search in the physical memory pages in the retrieved area in the ascending order of memory addresses after the area of the physical memory pages is retrieved and allocating unoccupied physical memory pages having the damage level to the memory request if unoccupied physical memory pages are retrieved;
   C2) conducting a search in an area of the physical memory pages having the same damage level in the ascending order of the sizes if the memory request is the successive physical memory pages having the same damage level whose capacity is less than or equal to M, wherein M is a predetermined threshold of the unoccupied successive physical memory pages having the same damage level, conducting a search in the area of the memory pages having the damage level in the ascending order of physical addresses after the area of the physical memory pages having the damage level satisfied to the memory request is retrieved and allocating unoccupied successive physical memory pages having the same damage level to the memory request; and
   C3) conducting a search in an area of the physical memory pages having the same damage level in descending order of their sizes if the memory request is successive physical memory pages having the same damage level whose capacity is greater than M, conducting a search in the area in the descending order of the physical addresses if the area of the physical memory pages having the same damage level satisfied to the memory request is retrieved and allocating the unoccupied successive physical memory pages having the same damage level to the memory request if an unoccupied physical memory pages having the damage level is retrieved.

8. The allocation method of claim 7, wherein the step C) further comprises:
   C4) updating the allocation information of the physical memory pages and mapping the allocated physical memory pages into a logical address space when the memory request is the memory of the logical address space.

9. The allocation method of claim 4, wherein the damage level of physical memory pages are superior pages, moderate pages and inferior pages.

10. The allocation method of claim 9, wherein the step C0) further comprises:
    determining that the moderate memory is compatible with the electronic system if the following inequalities are right:

$L'>=L,$ $N'>=N,$ $L'+L1'>=L+L1,$ $N'+N1'>=N+N1,$ wherein L' is an overall capacity of the superior page, L1' is an overall capacity of the moderate page, N' is a capacity of an area of maximal successive superior page, N1' is a capacity of an area of maximal successive moderate page, L is an occupied maximal capacity of the superior page, L1 is an occupied maximal capacity of the moderate page, N is an occupied maximal capacity of the successive superior page, and N1 is an occupied maximal capacity of the successive moderate page.

11. The allocation method of claim 9, wherein the step C) further comprises:
    C1') conducting a search in areas of superior pages or moderate pages in ascending order of the sizes if the received request is superior pages or moderate pages, conducting a search in the area of superior pages or moderate pages in the ascending order of the physical addresses if an area of superior pages or moderate pages satisfied to the memory request is retrieved and allocating the unoccupied superior pages or moderate pages to the memory request if unoccupied superior pages or moderate pages are retrieved;
    C2') conducting a search in areas of the superior pages or moderate pages in the moderate memory in the ascending order of their sizes if the received memory request is successive superior pages whose capacity is less than or equal to K, or if the received memory request is successive moderate pages whose capacity is less than or equal to K1, wherein K is a predetermined threshold of the unoccupied successive superior pages and K1 is a predetermined threshold of the unoccupied successive moderate pages, conducting a search in an area of the memory pages having the same damage level in ascending order of physical addresses if the area of the physical memory pages having the same damage level satisfied to the memory request is retrieved and allocating unoccupied successive physical memory pages to the memory request if the unoccupied successive physical memory pages having the same damage level satisfied the search condition is retrieved; and C3) conducting a search in areas of the superior pages or moderate pages in descending order of their sizes if the memory request is successive superior pages whose capacity is greater than K, or if the memory request is successive moderate pages whose capacity is greater than K1 and conducting a search in an area in the descending order of the physical addresses if an area of superior pages or moderate pages satisfied to the memory request is retrieved and allocating unoccupied successive physical memory pages having the same damage level to the memory request if the unoccupied successive physical memory pages having the same damage level are retrieved.

12. The allocation method of claim 11, wherein the step C) further comprises:

C4') updating the allocation information of the physical memory pages and mapping the allocated physical memory pages into a logical address space if the memory request is the memory of the logical address space.

13. An allocation apparatus in an electronic system including memory and a controller and/or a processor, comprising:

a paging unit used for partitioning moderate memory into a plurality of physical memory pages having predetermined page size according to the predetermined page size;

a memory scanning unit used for scanning the moderate memory using the predetermined page size and recording the physical address and damage degree of each physical memory page; and a memory allocation unit used for obtaining allocation information of the physical memory pages if a memory request is received and allocating physical memory to the memory request based on the recorded physical address and damage degree of each physical memory page and the obtained allocation information.

14. The allocation apparatus of claim 13, wherein the allocation apparatus further comprises:

a judgment unit used to judge if the moderate memory is compatible with the electronic system according to the damage degree of the moderate memory obtained by the memory scanning unit and a predetermined threshold of moderate memory compatible with the electronic system; and/or a classification unit used to classify physical pages of the moderate memory and obtain a damage level of each physical memory page based on the damage degree of the physical page and a predetermined classification standard of the physical memory pages.

15. The allocation apparatus of claim 14, wherein the memory allocation unit comprises:

a single page allocation unit used to conduct a search in areas of the physical memory pages having the same damage level in ascending order of their areas, if the received memory request is physical memory pages having any single damage level, conduct a search in the memory pages in the retrieved area in the ascending order of memory addresses after the area of the physical memory pages is retrieved, allocate unoccupied physical memory pages having the damage level to the memory request if unoccupied physical memory pages are retrieved;

a first successive allocation unit used to conduct a search in areas of the physical memory pages having the same damage level in ascending order of their areas if the memory request is the successive physical memory pages having the same damage level whose capacity is less than or equal to M, wherein M is a predetermined threshold of the unoccupied successive physical memory pages having the same damage level, conduct a search in the area of the memory pages having the same damage level in the ascending order of physical addresses after the area of the physical memory pages having the damage level satisfied to the memory request is retrieved, allocate unoccupied successive physical memory pages having the same damage level to the memory request; and a second successive allocation unit used to conduct a search in areas of the physical memory pages having the damage level in descending order of the sizes if the memory request is successive physical memory pages having the same damage level whose capacity is greater than M, conduct a search in the area in the descending order of the physical addresses if the area of the physical memory pages having the damage level satisfied to the memory request is retrieved, allocate the unoccupied successive physical memory pages having the same damage level to the memory request if the unoccupied physical memory pages having the damage level are retrieved.

* * * * *